United States Patent [19]
Inoue

[11] Patent Number: 5,487,034
[45] Date of Patent: Jan. 23, 1996

[54] SEMICONDUCTOR MEMORY DEVICE AND METHOD FOR WRITING DATA THEREIN

[75] Inventor: Tatsuro Inoue, Tokyo, Japan

[73] Assignee: NEC Corporation, Tokyo, Japan

[21] Appl. No.: 308,342

[22] Filed: Sep. 19, 1994

[30] Foreign Application Priority Data

Sep. 27, 1993 [JP] Japan ................................ 5-239710

[51] Int. Cl.⁶ ........................... G11C 7/00; G11C 11/409
[52] U.S. Cl. ............................... 365/185.18; 365/189.01; 365/189.04; 365/185.16
[58] Field of Search ........................... 365/185, 900, 365/182, 189.01, 189.04

[56] References Cited

U.S. PATENT DOCUMENTS

| | | | |
|---|---|---|---|
| 3,934,233 | 1/1976 | Fisher et al. | 340/173 |
| 4,021,781 | 5/1977 | Caudel | 340/172 |
| 4,387,447 | 6/1983 | Klaas et al. | 365/203 |
| 4,888,734 | 12/1989 | Lee et al. | 365/900 |
| 5,043,940 | 8/1991 | Harari | 365/900 |
| 5,267,209 | 11/1993 | Yoshida | 365/230.01 |

FOREIGN PATENT DOCUMENTS

| | | |
|---|---|---|
| 480544 | 7/1983 | Japan. |
| 62-84496 | 4/1987 | Japan. |

OTHER PUBLICATIONS

R. Shirota et al., "An Accurate Model of Subbreakdown Due to Band-to-Band Tunneling and Its Application", IEDM 88, pp. 26–29.

Primary Examiner—David C. Nelms
Assistant Examiner—Tan Nguyen
Attorney, Agent, or Firm—Sughrue, Mion, Zinn, Macpeak & Seas

[57] ABSTRACT

A method for writing data into a memory transistor having a floating gate includes applying a first voltage to a control gate electrode of memory transistor and applying a second voltage to both the source and the drain electrodes of memory transistor, the second voltage being lower than the first voltage. Data is written to the memory transistor by electrons injected into the floating gate due to the F-N tunnel effect. EEPROM comprises a simultaneous-write control circuit for controlling X-address decoder and Y-address decoder so as to simultaneously select all of word lines and all of bit lines, and a source switching circuit for applying a potential equal to the drain potential to the source electrode. All of memory transistors undergo a simultaneous write operation without utilizing a channel current, so that the current consumption can be reduced in the writing operation. Further, the amount of time for pre-erasure writing operation can be reduced for a higher speed in operation of the EEPROM.

9 Claims, 5 Drawing Sheets

SEMICONDUCTOR MEMORY DEVICE AND METHOD FOR WRITING DATA THEREIN

BACKGROUND OF THE INVENTION (a) Field of the Invention

The present invention relates to a semiconductor memory device and a method for writing data therein and, more particularly, to an electrically erasable and programmable semiconductor memory device and a method for writing data therein.

(b) Description of the Related Art

An electrically programmable ROM is one of nonvolatile semiconductor memory devices into which data are electrically written. One conventional electrically programmable ROM (hereinafter called "EPROM") is described in Japanese Patent Laid-Open Publication No. 62(1987)84496).

Recently, an electrically erasable and programmable ROM (hereinafter called "EEPROM") such as described in Japanese Patent Publication No. 4(1992)-80544 has come to public attention. In an EEPROM, a dispersion or variation is inevitably produced in threshold for electrically erasing data therefrom among memory transistors. In order to eliminate the variations, there has generally been adopted an operation off a so-called pre-erasure writing in which all of the memory transistors in a memory cell array undergo a write operation before their erasure so that the thresholds of the memory transistors for erasure are made uniform among the memory transistors.

However, when the pre-erasure write operation is carried out in a conventional method, channel current flows in each of the memory transistors during the write operation. Therefore, if data are simultaneously written into all the cells, an extremely large current is consumed in the memory cell array. Accordingly, there has been adopted a method in which data are serially written on a 1-byte (8-bit) or 1-word (16-bit) basis for the pre-erasure write process, taking into consideration of the restriction imposed upon the total current consumption. Therefore, a large amount of time is required until all of the memory transistors have undergone the write operation before their erasure. This hinders the semiconductor memory device from operating at a higher speed.

SUMMARY OF THE INVENTION

In view of the foregoing problem involved in the conventional method for writing data into an EEPROM, it is an object of the present invention to provide a semiconductor memory device and a method for writing data therein, in which current necessary for writing operation is reduced, thereby allowing a large number of memory transistors to undergo a write process and making it possible to reduce the amount of time required for completing the write process for all of the memory transistors.

In accordance with the present invention, there is provided an improved method for writing data into a semiconductor memory device having a semiconductor substrate and a plurality of memory transistors arrayed in rows and columns on a main surface of said substrate, the memory transistors each having source and drain regions, a floating gate and a control gate electrode. The method includes applying first positive voltage to the control gate electrode relative to the semiconductor substrate and applying a second positive voltage lower than the first positive voltage to each of the drain and source regions relative to the semiconductor substrate to thereby inject electrons into the floating gate.

Further, in accordance with the present invention, there is provided a semiconductor memory device comprising: a semiconductor substrate; a plurality of memory transistors arrayed in rows and columns on the semiconductor substrate, the memory transistors each having a source and a drain regions, a floating gate and a control gate electrode; a word line disposed For each row of the memory transistors and connected to each control gate electrode of corresponding row of the memory transistors; a bit line disposed For each column of the memory transistors and connected to each drain region of corresponding column of the memory transistors; a source line disposed for each pair of columns of the memory transistors and connected to each source region of corresponding one of the memory transistors; a word line selection circuit for selecting at least one word line to apply a first positive voltage thereto relative to the semiconductor substrate; a bit line selection circuit for selecting at least one bit line to apply a second positive voltage thereto relative to the semiconductor substrate, the second voltage being lower than the first voltage; a simultaneous-selection control circuit for controlling the word line selection circuit and the bit line selection circuit to simultaneously select a plurality of the word lines and a plurality of the bit lines; and a switching circuit for applying the second positive voltage to each source line corresponding to each of the selected bit lines in response to the selective operation of the simultaneous selection control circuit.

In the conventional method for writing data into a memory transistor, as described above, a predetermined voltage is applied between the source and the drain of the memory transistor so as to cause a channel current therebetween, which channel current produces hot electrons to be injected into the floating gate electrode.

We have carried out various studies on an EEPROM having a virtual grounding configuration, and have found that a sufficient amount of electrons are injected into a floating gate by applying a first positive voltage between a substrate and a control gate electrode and applying a second positive voltage, which is lower than the first positive voltage, between the substrate and each of a source and a drain electrodes. Electrons to be injected into the floating gate is generated by applying the second voltage lower than the first voltage to the source and drain regions relative to the semiconductor substrate. The second voltage was selected between about 7 volts and about 10 volts while the first voltage was set about 14 volts or 13 volts. The first voltage of about 14 volts provided a better result than the first voltage of about 13 volts. The present invention has been achieved based on this finding. It is believed that the generation of electrons and injection thereof into a floating gate occurs due to a band-to-band tunneling and a Fowler-Nordheim (F-N) tunneling.

It is considered that the F-N tunnel effect occurs when an electric field within an insulting film reaches about $10^7$ V/cm or above. Thus, the first and second positive voltages are selected so that the electric field within the first oxide film becomes equal to or more than about $10^7$ V/cm. It is also considered that the intensity of electric field within the first insulation film depends on conditions such as the thickness of the first insulating film, distance between the source and the drain regions, etc. as well as on the first and second positive voltages. Accordingly, the magnitudes of the first and second positive voltages to be applied are not determined at fixed voltages but can be determined if the above-described conditions are fixed.

In the method and semiconductor memory device according to the present invention, since the second voltage is applied to each of source and drain regions for simultaneous writing, channel current does not flow through each memory transistor so that the current required for a write operation can be reduced. Therefore, current necessary to simultaneously write data into the memory transistors arranged in rows and columns can be reduced. Accordingly, the capacity of a power supply source or supply line for the memory transistors can be made smaller while data are simultaneously written into a plurality of rows and columns of memory transistors.

BRIEF DESCRIPTION OF THE DRAWINGS

The above and other objects, features and advantages of the present invention will be more apparent from the following description, taken in conjunction with accompanying drawings in which.

DETAILED DESCRIPTION OF THE PREFERRED EMBODIMENT

Figure 1:
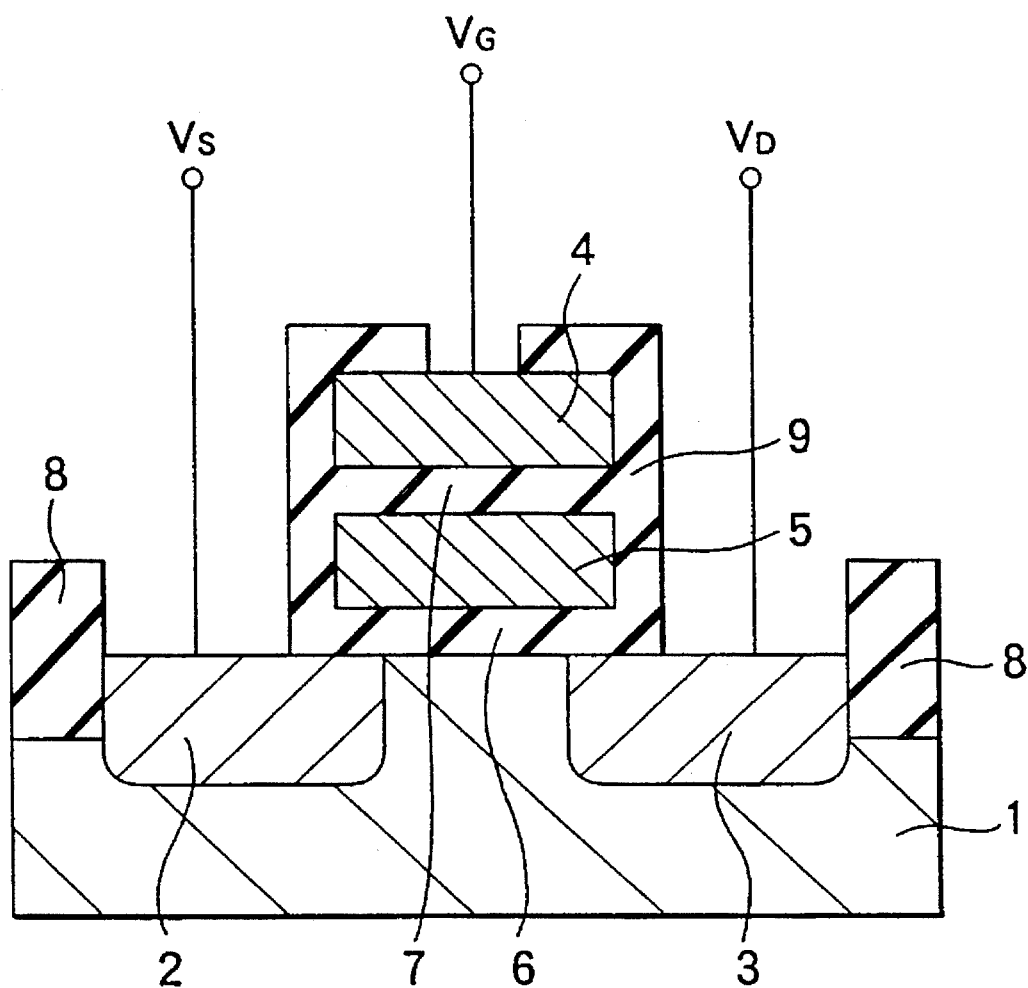
FIG. 1 is a cross-sectional view of a memory transistor in a conventional memory device.

Before describing the present invention, the problem involved in a conventional memory device will be described for the sake of understanding of the present invention. FIG. 1 is a cross-sectional view showing a memory transistor constituting a memory cell in an EPROM of the type described in Japanese Laid-Open Pub. No. 62(1987)-84496 as mentioned above. In the memory transistor shown in FIG. 1, a source region 2 and a drain region 3, which respectively constitute n-regions, are formed on a main surface of a P-type silicon semiconductor substrate 1 as by ion implantation. A first gate oxide film 6, a floating gate electrode 5, a second gate oxide film 7 and a control gate electrode 4 are consecutively formed on a channel region of the semiconductor substrate between the source region 2 and the drain region 3. The source, drain and gate electrodes are shown as connected to voltage sources $V_S$, $V_D$ and $V_G$, respectively during a write process before erasure.

Both the gates 4 and 5 are composed of polycrystalline silicon, for example, while the gate oxide films 6 and 7 are composed of silicon dioxide, for example. A side wall oxide film 9 is formed on the side walls of the gates 4 and 5. Further, a field oxide film 8 is provided to define an isolation region between the memory transistors.

In the conventional method for writing data into the memory cell, the semiconductor substrate 1 and the source region 2 are first grounded. Next, a positive voltage $V_G$ of 12 V or 25 V, for example, is applied to the control gate 4, while a positive voltage $V_D$ of 8 V, for example, is applied to the drain region 3. Accordingly, a channel current flows in the memory transistor so that high-energy hot electrons accelerated in a depletion layer generated in the vicinity of the drain region 3 are injected through the first gate oxide film 6 into the floating gate 5, thereby writing data into the memory transistor.

Figure 2:
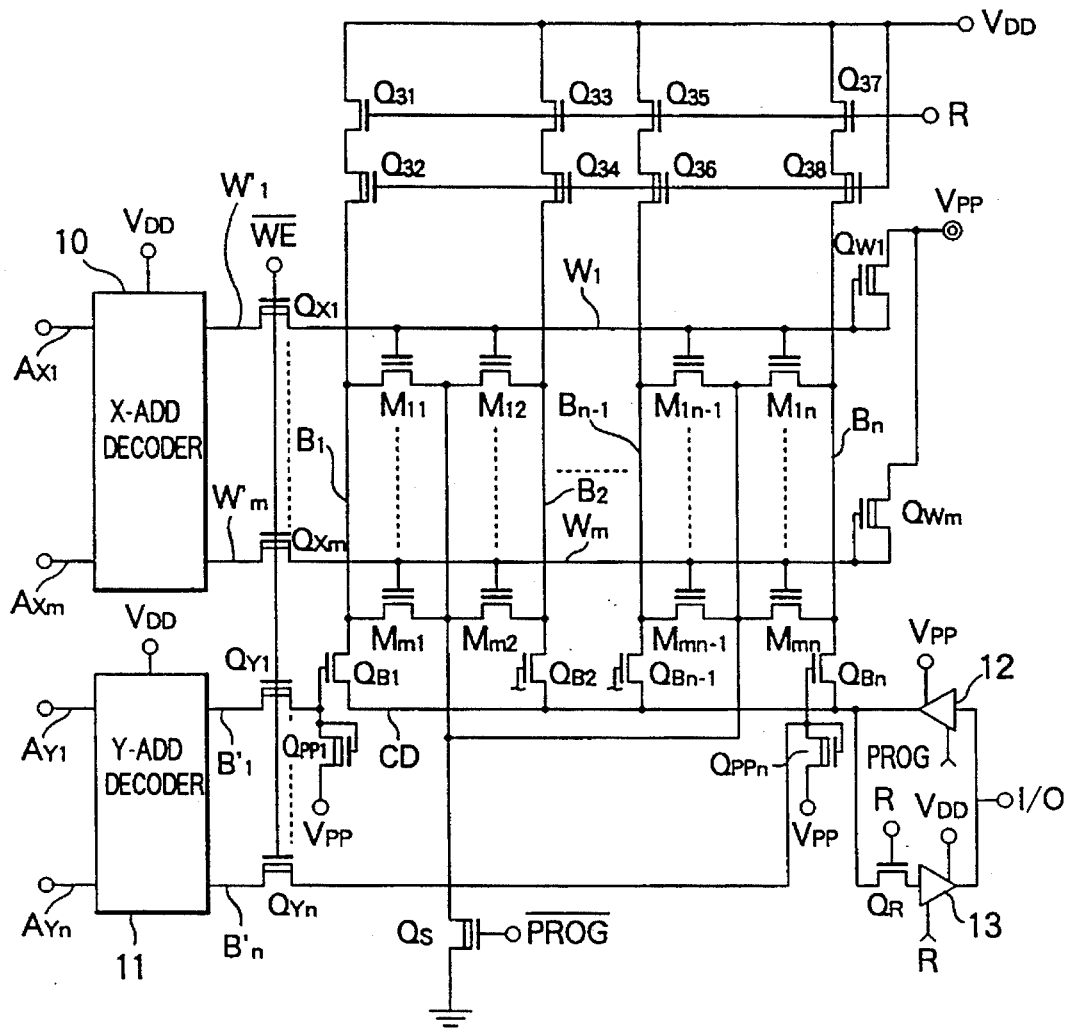
FIG. 2 is a circuit diagram of the conventional semiconductor memory device of FIG. 1.

FIG. 2 is a circuit diagram showing the conventional EEPROM having a plurality of memory transistors such as shown in FIG. 1 in a memory cell array. The circuit is formed on a single semiconductor substrate by a known semiconductor integrated circuit fabrication technology.

In FIG. 2, reference symbols M11–Mmn denote memory transistors arranged in a matrix. Control gates of a row of memory transistors M11–M1n arranged in a first row, for example, are connected to first word line W1. Likewise, control gates of a row of memory transistors Mm1–Mmn arranged in an m-th row are connected to an m-th word line Wm.

Further, drains of memory transistors M11–Mm1 arranged in the first column, for example, are connected to first bit line B1. Likewise, drains of columns of memory transistors M12–Mm2, M1n-1–Mmn-1 and M1n–Mmn arranged in respective columns are connected to respective bit lines B2, Bn-1 and Bn as shown in the drawing. Two source regions of memory transistor pairs disposed adjacent to each other in a row direction, e.g., source regions of memory transistors M11 and M12 or memory transistors Mm1 and Mm2 are formed as common regions to improve the degree of integration.

Depletion transistors Qw1–Qwm, which function as high-resistance elements, are respectively connected between the word lines W1–Wm and a high-voltage terminal Vpp for writing use. Depletion transistors Qx1–Qxm for switching use are respectively connected between word lines W1–Wm and output lines W1'–Wm' of X-address decoder 10. In FIG. 2 and other drawings, depletion transistors Qw1, Qwm etc. are represented by symbols in which lines are added between sources and corresponding drains.

All of bit lines B1–Bn are electrically connected to data line CD through respective depletion transistors QB1–QBn. The gates (only gates of the switching transistors QB1 and QBn are shown in FIG. 2) of the switching transistors QB1–QBn used for selecting bit lines are connected to a high-voltage terminal Vpp through depletion transistors Qpp1–Qppn, which function high-resistance elements, in a manner similar to word lines W1–Wm. The gates of the switching transistors QB1–QBn are also connected to corresponding output lines of Y-address decoder 11 through depletion transistors QY1–QYn controlled based on a control signal input to write control line $\overline{WE}$.

When data is to be written into memory transistor M11, for example, a high voltage is supplied to the high-voltage terminal Vpp from a power supply source (not shown) outputting 12 V or 25 V. Also, output line W1' of X-address decoder 10 is driven up to a high-level of about 5 V while write control line $\overline{WE}$ is driven down to a low-level of about 0 V so that depletion transistor Qx1 is turned off. Since word line W1 is connected to high-voltage terminal Vpp via depletion transistor Qw1 acting as a high-resistance element, word line W1 connected to the control gate of memory transistor M11 is supplied with a high voltage corresponding to the voltage applied to high-voltage terminal Vpp.

At this stage, an unselected word line, e.g., word line Wm is supplied with a low-level potential of about 0 V in accordance with the output of X-address decoder 10 because depletion transistor Qxm is turned on due to a low-level of about 0 V on the output line Wm' of X-address decoder 10 and a low-level of about 0 V on write control line $\overline{WE}$.

On the other hand, a selected output line B1' of Y-address decoder 11 is driven up to a high-level of about 5 V and write control line $\overline{WE}$ is at a low-level of about 0 V so that depletion transistor QY1 is turned off. Also, depletion transistor Qpp1 is turned on due to a high voltage supplied From high-voltage terminal Vpp so that switching transistor QB1 connected to bit line B1 is turned on. As a result, bit line B1 connected to the drain of memory transistor M11 is supplied with a high voltage which is output from write circuit 12 and has a voltage corresponding to the voltage at high-voltage terminal Vpp.

At this stage, an unselected bit line, e.g., bit line Bn is not supplied with a high voltage from the write circuit 12 because the gate of switching transistor QBn is supplied with a low-level of about 0 V according to the output of Y-address decoder 11. This is because depletion transistor QYn is turned on based on a low-level of about 0 V on output line Bn' and a low-level of about 0 V on control line $\overline{WE}$.

Since memory transistor M11, which has been turned on in response to the high voltage supplied to the selected word line W1 in the above-described manner, is supplied with channel current through bit line B1 selected in the same manner, hot electrons are injected into the floating gate of memory transistor M11 so that the writing of data therein is effected. It has been considered that writing data into a memory transistor requires channel current in the memory transistor for generating a sufficient amount of hot electrons therein, that is, without channel current, sufficient electrons could not be injected to effect writing data in the memory transistors.

Now, the present will be described with reference to the accompanying drawings.

Figure 3A:
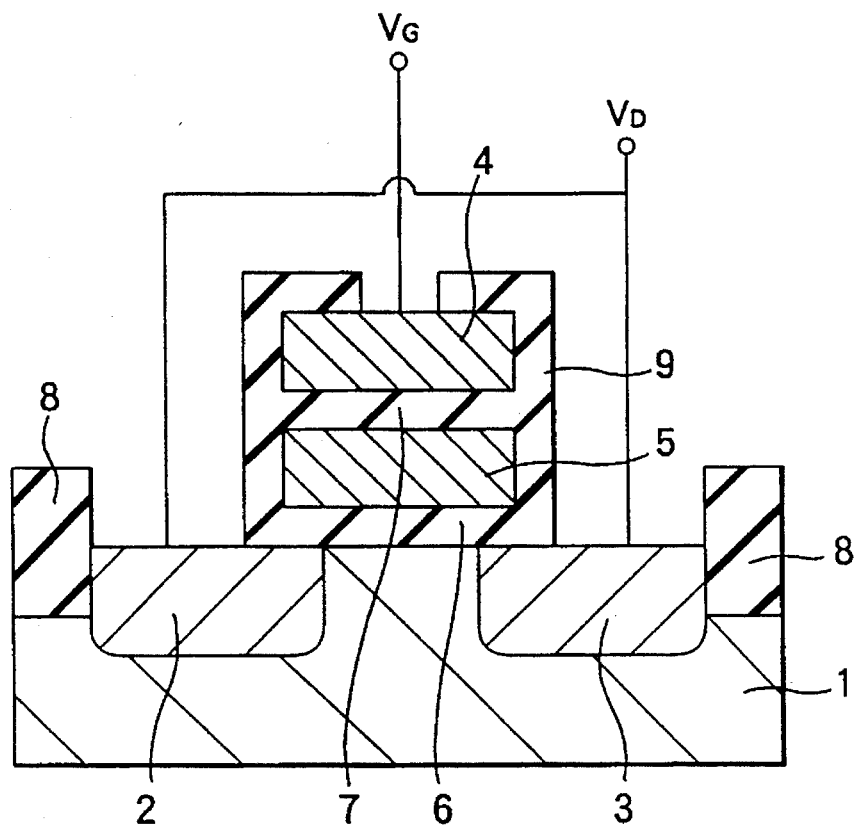
FIG. 3A is a cross-sectional view showing a memory transistor in a memory device according to an embodiment of the present invention.

FIG. 3A is a cross-sectional view showing the structure off a memory transistor in an EEPROM implemented as a semiconductor memory device according to a first embodiment of the present invention. The memory transistor has a structure similar to that of a conventional memory transistor described with reference to FIG. 1. In FIG. 3A, a source 2 and a drain 3, which respectively form n-type regions, are formed on a main surface of a P-type silicon semiconductor substrate 1 by ion implantation. A first gate oxide film 6, a floating gate 5, a second gate oxide film 7 and a control gate 4 are consecutively formed on a channel region of a semiconductor substrate 1 between the source 2 and the drain 3. The source 2 and drain 3 are shown as connected to voltage source $V_D$ while control gate electrode 4 is shown as connected to voltage source $V_G$ during effecting write process before erasure.

The first gate oxide film 6 is made of silicon dioxide and having a thickness of 115 angstroms, for example. The floating gate 5 is made of polycrystalline silicon and having a thickness of 1500 angstroms, for example. The second gate oxide film 7 has a three-layer structure in which a silicon oxide film, a nitride film and a silicon oxide film are consecutively formed. The control gate 4 is made of polycrystalline silicon and having a thickness of 3000 angstroms, for example. A side wall oxide film 9 having a thickness of 200 angstroms, for example, is formed on both sides of the control gate 4 and the floating gate 5. Further, a field oxide film 8, which defines isolation regions, is made of silicon dioxide having a thickness of 6000 angstroms, for example.

Figure 3B:
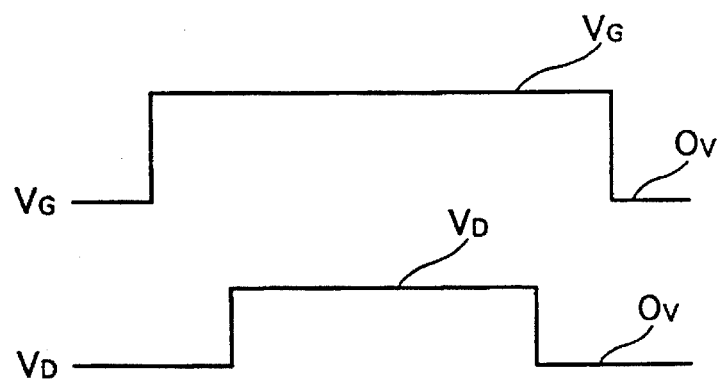
FIG. 3B is a timing chart for describing the operation of the memory transistor in the memory device of FIG. 3A during a writing operation.

FIG. 3B shows a timing chart of voltages $V_G$ and $V_D$ applied to the control gate 4 and source and drain regions 2 and 3 for writing data into the memory transistor of FIG. 3A by a simultaneous write process in accordance with the embodiment of the present invention. P-type semiconductor substrate 1 is grounded and control gate 4 is supplied with a high positive voltage $V_G$, e.g., 12 V. An intermediate positive voltage $V_D$, e.g., 8 V is supplied to both the source 2 and the drain 3.

In this operation, a depletion layer having a high electric field is generated in the vicinity of the P-N junction between the source 2 and the drain 3 due to the voltage $V_D$ applied to the source 2 and the drain 3 relative to the semiconductor substrate, so that pairs of electrons and positive holes are generated by the high electric field. This phenomenon is generally called band-to-band tunneling and is described in detail by R. Shirota et al. in "AN ACCURATE MODEL OF SUBBREAKDOWN DUE TO BAND-TO-BAND TUNNELING AND ITS APPLICATION" (IEDM 1988 p.26 to p.29).

Further, a high electric field is generated within the first gate insulating film 6 due to the high-voltage applied to the control gate 4. When the electric field generated within the first gate insulating film 6 reaches $10^7$ V/cm or higher, an F-N tunneling occurs. It is considered float some electrons among the pairs of electrons and positive holes generated in the depletion layer pass through the first gate insulating film 6 due to the F-N tunneling. Hence, electrons are injected into the floating gate 5 so that writing operation is effected.

Figure 4:
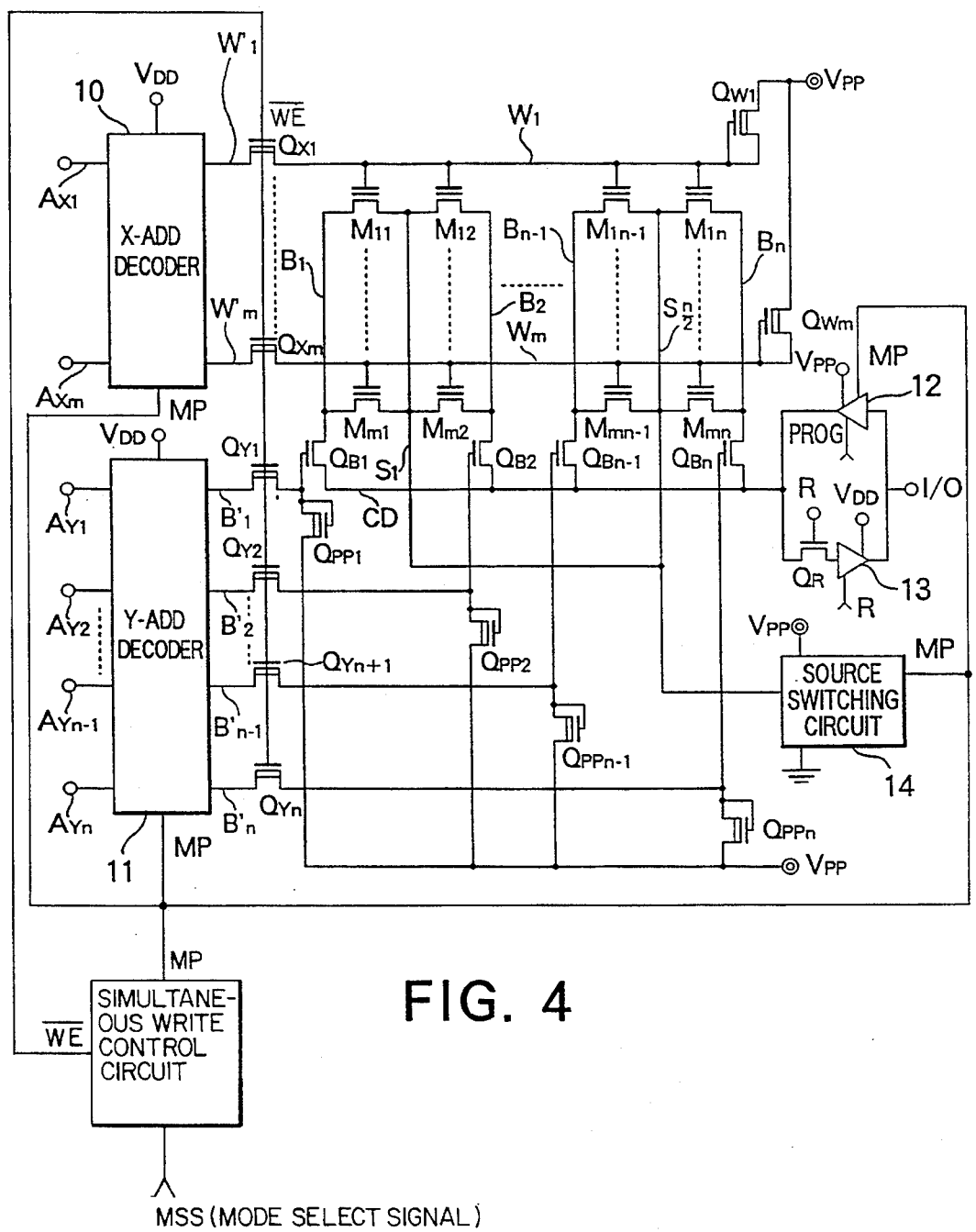
FIG. 4 is a circuit diagram showing the semiconductor memory device of FIG. 3A.
Figure 5:
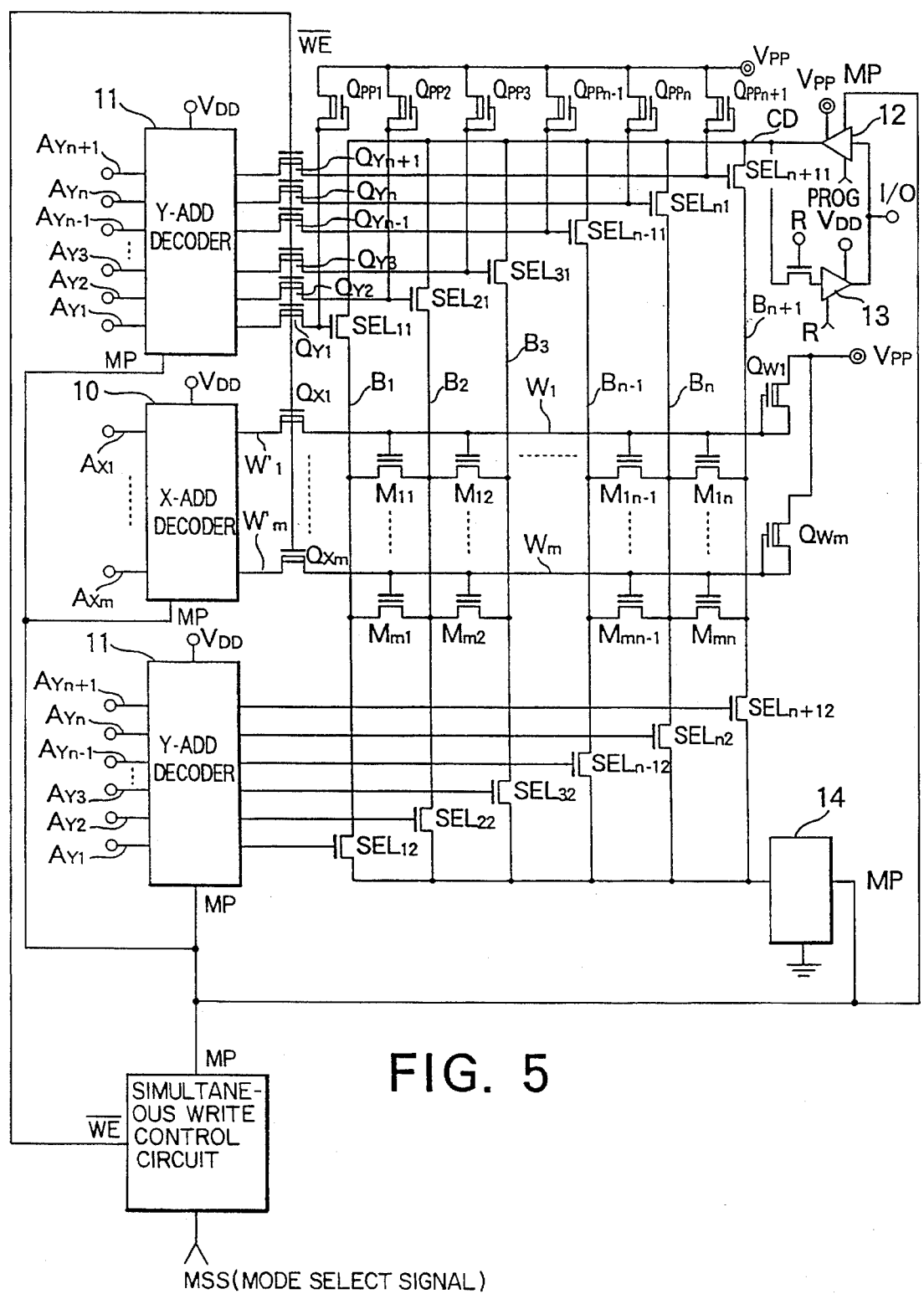
FIG. 5 is a circuit diagram showing a semiconductor memory device according to a second embodiment of the present invention.

FIGS. 4 and 5 show a circuit diagram of the EEPROM according to an embodiment of the present invention, respectively. The circuit of FIGS. 4 and 5 are fabricated on a single semiconductor substrate, respectively, using known semiconductor integrated circuit fabrication technology. Similar reference symbols are used throughout the drawings, hence, description of elements similar to those in FIG. 2 are not made hereinafter for avoiding a duplication. The EEPROM according to the embodiment of FIG. 4 differs From the conventional EPROM shown in FIG. 2 in the Following points. First, in FIG. 4, simultaneous-write control circuit, which controls both X-address decoder 10 and Y-address decoder 11 so as to select all of word lines and all of bit lines, is provided separately from a selective-write control circuit (not shown) for enabling a simultaneous write of data into all of memory transistors in the memory cell array. Second, a source switching circuit 14 is provided so as to change a source potential depending on signal representing a selective write operation or a simultaneous write operation. Simultaneous-write control circuit outputs a control signal MP for controlling X-address decoder 10, Y-address decoder 11, write circuit 12 and source switching circuit 14.

When a simultaneous write operation is to be effected according to the principle of the present embodiment, simultaneous-write control circuit first supplies a control signal MP of a low level ( e.g., 0 V). In response to the low-level of the control signal MP, X-address decoder 10 enters into a mode for selecting all of the word lines, so that X-address decoder 10 outputs signals of a high level (e.g., 5 V) to all of output lines W1'–Wm' thereof. Therefore, depletion transistors Qx1–Qxm are turned off in response to the high-level of outputs of X-address decoder and a signal of a low level (e.g., 0 V) on write control line $\overline{WE}$, so that a high voltage (e.g., 12 V) is supplied from high-voltage terminal Vpp to each of word lines W1–Wm via a corresponding one of depletion transistors Qw1–Qwm.

On the other hand, Y-address decoder 11 enters into a mode for selecting all of the bit lines in response to the low-level of the control signal MP. Therefore, signals of a high level (e.g., 5 V) are supplied to all of output lines B1'–Bn' of Y-address decoder 11. Thus, depletion transistors QY1–QYn are all turned off in response to the high-level outputs of Y-address decoder 11 and the low-level signal on write control line $\overline{WE}$, so that a signal of a high level (e.g., 12 V) is supplied to the gates of switching transistors QB1–QBn from high-voltage terminal Vpp via the depletion transistors Qpp1–Qppn. As a result, switching transistors QB1–QBn are turned on. Thus, an intermediate high voltage (e.g., 8 V) is supplied from high-voltage terminal Vpp to all of bit lines B1–Bn via the switching transistors QB1–QBn in response to the control signal MP input to the write circuit 12.

Each of of source lines S1–Sn/2 connected to each row pair of memory transistors is connected to the output of source switching circuit 14 which outputs another intermediate high voltage having the same potential as that of the voltage applied to each of the bit lines B1–Bn. Therefore, each of source lines S1–$S_{n/2}$ is supplied with the intermediate high voltage in response to the low-level of the control signal MP.

After the above operation is effected in the EEPROM, the potentials of all of word lines W1–Wm are at a high level (e.g., 12 V), whereas the potentials of all of bit lines B1–Bn and all of source lines S1–Sn/2 are at an intermediate high level (e.g., 8 V). In this state, electrons, which have generated in the vicinity of source and drain due to the band-to-band tunneling, pass through the first gate insulating films into the floating gates of the memory transistors due to the F-N tunneling, thereby writing data into the memory transistors. The current required For executing the data write process is extremely smaller than that required in the conventional memory in which channel current is utilized for a write operation. Hence, a simultaneous write operation can be effected and the amount of time required for a pre-erasure write operation can be reduced.

FIG. 5 is a circuit diagram showing an EEPROM according to a second embodiment of the present invention. A memory cell array of the :present embodiment is implemented in a virtual grounding configuration which requires only one contact per pair of memory transistors. Typical examples of memory cell arrays having a virtual grounding configuration include those described in U.S. Pat. Nos. 3,916,169, 3,934,233, 4,021,781 and 4,387,477.

In FIG. 5, reference symbols M11–Mmn denote memory transistors, which are arranged in a matrix so as to form a memory cell array. Control gates of the memory transistors M11–M1n arranged in a row, e.g., a first row are connected to first word line W1. Likewise, control gates of the memory transistors Mm1–Mmn arranged in an m-th row are connected with m-th word line Wm. The outputs of Y-address decoder are divided into two groups of output lines.

Further, the drains of the memory transistors M11–Mm1 arranged in a column, e.g., a first column are connected to first bit line B1. Likewise, the drains of the memory transistors M12–Mm2 arranged in a second column are connected to second bit line B2. In addition, second bit line B2 is also connected to the source of the memory transistors M11–Mm1, in a similar manner, the drains of the memory transistors M1n–Mmn arranged in an n-th column and the sources of the memory transistors M1n-1–Mmn-1 arranged in an (n−1)-th column are connected to n-th bit line Bn. The sources of the memory transistors M1n–Mmn arranged in the n-th column are electrically connected to (n+1)-th bit line Bn+1. Thus, even-numbered bit lines of FIG. 5 correspond to the source lines of FIG. 4.

Depletion transistors Qw1–Qwm, which act as high resistance elements, are connected between the word lines W1–Wm and high-voltage terminal Vpp for writing use. This configuration is similar to that of FIG. 4.

Each of bit line selection transistors $Sel_{11}$–$Sel_{n+11}$ in a first group is connected between corresponding one of bit lines B1–Bn and the output of write circuit 12, while each of bit selection transistors $Sel_{12}$–$Sel_{n+12}$ in a second group is connected between corresponding one of bit lines B1–Bn and the output of source switching circuit 14. Gate electrodes of bit line selection transistors $Sel_{11}$–$Sel_{n+11}$ are connected to respective output lines in a first output group of of Y-address decoder 11 through respective depletion transistors QY1–QYn+1, which are controlled by write control signal $\overline{WE}$, whereas gate electrodes of bit line selection transistors $Sel_{12}$–$Sel_{n+12}$ are directly connected to respective output lines in a second output group of Y-address decoder 11.

Bit line selection transistors $Sel_{11}$–$Sel_{n+11}$ are connected to the output of write circuit 12 through data line CD in a manner similar to the first embodiment. The gates of bit line selection transistors $Sel_{11}$–$Sel_{n+11}$ are connected to high-voltage terminal Vpp through respective depletion transistors Qpp1–Qppn+1 acting as high resistance elements, in a manner similar to word lines W1–Wm.

In the EEPROM of FIG. 5, each of X-address decoder 10, Y-address decoder 11, write circuit 12 and source switching circuit 14 is controlled by a control signal MP supplied from an unillustrated simultaneous-write control circuit. The output line of source switching circuit 14 is controlled to have a voltage either a floating potential or a ground potential.

In writing operation of EEPROM of FIG. 5, all of word lines W1–Wm are first driven up to a high voltage. Since the manner at this stage is similar to that in the first embodiment, detailed description thereof will not be made here.

Next, all of bit lines B1–Bn+1 are driven up to a high-level. At this stage, all of the output lines of Y-address decoder 11 are set to a high level (e.g., 5 V) in response to the control signal MP of a low level (e.g., 0 V) input to Y-address decoder 11. Depletion transistors QY1–QYn+1 are turned off in response to a low-level signal (e.g., 0 V) on write control line $\overline{WE}$ and the high level of output lines of Y-address decoder 11.

Thus, a high level signal (e.g., 12 V) is supplied from high-voltage terminal Vpp through the depletion transistors Qpp1–Qppn+1 to time gates of first bit line selection transistors $Sel_{11}$–$Sel_{n+11}$. Accordingly, first bit line selection transistors $Sel_{11}$–$Sel_{n+11}$ are turned off so that a high voltage is supplied from write circuit 12 to each of bit lines B1–Bn+1 in response to the control signal MP input to the write circuit 12. At this stage, each of bit line selection transistors $Sel_{12}$–$Sel_{n+12}$ connected to source switching circuit 14 is maintained in ON-state due to the high level output supplied from Y-address decoder 11.

The output line of source switching circuit 14 connected to bit line selection transistors $Sel_{12}$–$Sel_{n+12}$ is at a floating potential at a stage when the control signal MP is supplied to the source switching circuit 14. Accordingly, each of bit lines B1–Bn+1 is maintained at a high level having an intermediate potential at this stage, due to the high level supplied from each of first bit line selection transistors $Sel_{11}$–$Sel_{n+11}$. Data are written into all of the memory transistors, based on the intermediate high voltages supplied to all of bit lines B1–Bn+1 and the high voltages supplied to all of word lines W1–Wm.

Since the EEPROM of FIG. 5 employs a virtual grounding configuration, the cell array can be fabricated in a high density integration. However, the manner in which data are written in the memory transistor is similar to that in the first embodiment, in which electrons are injected into floating gates due to the tunnel effect by applying a high-voltage to each of the control gates of memory transistors and applying an intermediate high-voltage to both the source and the drain of each memory transistor.

Further, such a construction is common to the first and second embodiments in which the EEPROM comprises a simultaneous-write control circuit for controlling a word line selection circuit and a bit line selection circuit so as to select all of word lines and all of bit lines and a source switching circuit for switching potentials at the source lines or bit lines upon executing a simultaneous write operation. Although all of memory transistors are written simultaneously in both the embodiments, the memory cell array may be divided into several blocks of memory transistors and the write operation may be successively applied to each of the several blocks.

In a conventional EEPROM of a 16-Mbit level integration, a write operation thereof is carried out word by word (16 bit), because of a limitation on current consumption, using a write control pulse having, for example, a 10 μsec pulse duration. In this case, the amount of time required for a pre-erasure write operation is about 10 seconds (10 μsec×16×10$^6$ bit÷16 bit=10 sec). In the present invention, however, since a channel current is not utilized for a write process, a large number of memory transistors can simultaneously undergo a write operation. In principle, the simultaneous write operation can be effected within the order of 10 μsec through adopting a simultaneous writing operation.

Although the present invention is described with reference to the preferred embodiments, the present invention is not limited to such embodiments and it will be obvious for those ski lied in the art that various modifications or alterations can be easily made based on the above embodiments within the scope of the present invention.

What is claimed is:

1. A method for writing data into a semiconductor memory device having a semiconductor substrate and a plurality of memory transistors arrayed in rows and columns on a main surface of said substrate, said memory transistors each having source and drain regions, a floating gate and a control gate electrode, said method including applying a first positive voltage to said control gate electrode relative to said semiconductor substrate and applying a second positive voltage lower than the first positive voltage to each of said drain and source regions relative to said semiconductor substrate to thereby inject electrons into said floating gate.

2. A method for writing data into a semiconductor memory device as defined in claim 1 wherein said applying the first positive voltage and applying the second positive voltage are effected to all of said plurality of memory transistors simultaneously.

3. A method for writing data into a semiconductor memory device as defined in claim 1 wherein said applying the first positive voltage and said applying the second positive voltage generate an electric field having an intensity not lower than about 10$^7$ V/cm within said first insulating film.

4. A method for writing data into a semiconductor memory device as defined in claim 3 wherein the second positive voltage is between about 7 volts and 10 volts when the first positive voltage is about 14 volts.

5. A semiconductor memory device comprising: a semiconductor substrate; a plurality of memory transistors arrayed in rows and columns on said semiconductor substrate, said memory transistors each having a source and a drain regions, a floating gate and a control gate electrode; a word line disposed for each row of said memory transistors and connected to each control gate electrode of corresponding row of said memory transistors; a bit line disposed for each column of said memory transistors and connected to each said drain region of corresponding column of said memory transistors; a source line disposed for each pair of columns of said memory transistors and connected to each said source region of corresponding one of said memory transistors; a word line selection circuit for selecting at least one said word line to apply a first positive voltage thereto relative to said semiconductor substrate; a bit line selection circuit for selecting at least one bit line to apply a second positive voltage thereto relative to said semiconductor substrate, said second voltage being lower than said first voltage; a simultaneous-selection control circuit for controlling said word line selection circuit and said bit line selection circuit to simultaneously select a plurality of said word lines and a plurality of said bit lines; and a switching circuit for applying said second positive voltage to each said source line corresponding to each of the selected bit lines in response to the selective operation of the simultaneous selection control circuit.

6. A semiconductor memory device as defined in claim 5 wherein said simultaneous selection circuit simultaneously selects all of said word lines and all of said bit lines.

7. A semiconductor memory device as defined in claim 5 wherein said simultaneous selection circuit simultaneously selects a block of said word lines and a block of said bit lines.

8. A semiconductor memory device as defined in claim 5 wherein said second positive voltage is between about 7 volts and 10 volts while said first positive voltage is about 14 volts.

9. A semiconductor memory device comprising: a semiconductor substrate; a plurality of memory transistors arrayed in rows and columns on said semiconductor substrate in a virtual grounding configuration, said memory transistors each having a source and a drain regions, a floating gate and a control gate electrode; a word line disposed for each row of said memory transistors and connected to each control gate electrode of corresponding row of said memory transistors; a first bit line disposed for each column of said memory transistors and connected to each drain region of corresponding column of said memory transistors; a second bit lines disposed for each pair of columns of said memory transistors and connected to each said source region of corresponding pair of said memory transistors; a word line selection circuit for selecting at least one said word line to apply a first positive voltage thereto relative to said semiconductor substrate; a bit line selection circuit for selecting at least one said first bit line and corresponding said second bit line to apply a second positive voltage thereto relative to said semiconductor substrate, said second voltage being lower than said first voltage; a simultaneous-selection control circuit for controlling said word line selection circuit and said bit line selection circuit to simultaneously select a plurality of said word lines and a plurality of combinations of said first bit line and corresponding said second bit line.

* * * * *

UNITED STATES PATENT AND TRADEMARK OFFICE
CERTIFICATE OF CORRECTION

PATENT NO. : 5,487,034
DATED : January 23, 1996
INVENTOR(S) : Tatsuro INOUE

It is certified that error appears in the above-indentified patent and that said Letters Patent is hereby corrected as shown below:

Col. 1, line 17, after "(1987)", insert -- - --.

Col. 6, line 23, delete "float", insert --that--.

Col. 7, line 32, delete "For", insert --for--.

Col. 7, line 40, delete ":present", insert --present--.

Col. 9, line 38, delete "ski lied", insert --skilled--.

Signed and Sealed this

Twenty-third Day of July, 1996

BRUCE LEHMAN

*Attest:*

*Attesting Officer*     *Commissioner of Patents and Trademarks*